United States Patent [19]

Senaha et al.

[11] 4,448,855

[45] May 15, 1984

[54] HEAT RESISTANT REFLECTOR

[75] Inventors: Susumu Senaha; Suizo Kyo; Susumu Shimomura; Akira Akagami; Hiroshi Imai; Akira Ohno; Shitomi Katayama; Suguru Nomura, all of Kanagawa, Japan

[73] Assignees: Kiko Co., Ltd.; NHK Spring Co., Ltd., both of Kanagawa, Japan

[21] Appl. No.: 93,472

[22] Filed: Nov. 13, 1979

[30] Foreign Application Priority Data

Nov. 13, 1978 [JP] Japan ................... 53-138906

[51] Int. Cl.$^3$ .......................... G02B 5/08; B32B 15/04
[52] U.S. Cl. ..................... 428/632; 352/288; 352/292; 352/320; 427/124; 427/125; 427/245; 427/330; 427/163; 428/432; 428/433; 428/434; 428/457; 428/469; 428/472; 428/913
[58] Field of Search ............... 428/469, 472, 538, 539, 428/432-434, 913, 457, 629, 633, 631, 632, 697, 702; 427/124, 125, 295, 330, 163; 350/288, 292, 320

[56] References Cited

U.S. PATENT DOCUMENTS

| | | | |
|---|---|---|---|
| 2,333,534 | 11/1943 | Lang ................... | 428/469 X |
| 2,475,469 | 7/1949 | Bennett et al. .......... | 428/469 X |
| 2,482,054 | 9/1949 | Cocbert et al. .......... | 428/469 X |
| 2,776,598 | 1/1957 | Dreyer ................... | 350/288 X |
| 3,284,225 | 11/1966 | Smock et al. ............ | 428/469 X |
| 3,368,919 | 2/1968 | Casale et al. ............ | 428/469 X |
| 3,410,636 | 11/1968 | Herrick ................... | 350/288 |
| 3,516,720 | 6/1970 | Mauer ................... | 428/432 X |
| 3,687,713 | 8/1972 | Adams ................... | 350/288 |
| 3,978,273 | 8/1976 | Groth ................... | 428/434 |
| 4,009,947 | 3/1977 | Nishida et al. .......... | 428/433 X |
| 4,037,014 | 7/1977 | Gittleman .............. | 428/539 X |
| 4,198,449 | 4/1980 | Freller et al. .......... | 427/295 X |

*Primary Examiner*—Ellis P. Robinson
*Attorney, Agent, or Firm*—Sughrue, Mion, Zinn, Macpeak and Seas

[57] ABSTRACT

The present invention is intended for a heat resistant reflector in which a light reflective metal is vacuum coated on a metal or inorganic material substrate and in which on the surface of the vacuum coated layer is further vacuum coated a light transmissible ceramic and preferably, a ceramic having a crystalline substance. This reflector has a light reflective metal and a ceramic vacuum coated together, and thus, can form a thin film of the same replica as a substrate. Therefore, there is very little refraction or absorption of light due to a protective film, cnanges of total reflectivity, regular reflectivity or refractivity are very few and its manufacture as well is simple because of continuous vacuum coating with one and the same coating machine. Further, as this reflector is protected with a crystalline ceramic, it has good resistance to heat, light, weather and solvent, and since a ceramic having a low degree of oxidation is electrically conductive in some cases, it can be made antifogging by conduction. The surface is highly dense and there is very little loss of transparency or coloring deterioration with time. Rubbing scratches due to wiping of pollutants on the surface are difficult to inflict and the surface has the property of excellent durability.

8 Claims, No Drawings

HEAT RESISTANT REFLECTOR

DETAILED DESCRIPTION OF INVENTION

The present invention relates to a reflector suitable for use in illumination such as an illumination shade, various optical instruments, the sunlight, reflector etc., comprising a light reflecting layer and a protective layer disposed on a substrate consisting of a metal or inorganic substance.

The conventional light reflectors can be roughly classified as follows: Typical are (1) the reflector in which the surface of metal such as stainless steel or aluminum is subjected to buff polishing, electrolytic polishing or chemical polishing, (2) the reflector in which the surface of metal such as iron or aluminum is enameled with porcelain, (3) the reflector in which on the surface or back of glass or transparent resin there is coated metal such as aluminum by vacuum coating method or silver by a silver mirror reaction and (4) the reflector in which on the surface of the above (1) or (3) there is disposed a transparent resin coating.

However, the reflector in (1) needs polishing of the surface, by buff polishing, the finished surface being rough and with the metallic surface alone, it is very difficult to obtain regular reflective ability and it has the disadvantage that a wetting method such as electrolytic or chemical polishing has not only the problem of environmental pollution caused by the chemicals used does not have good specular reflective ability but is insufficient to form a light reflecting surface.

In the case of the reflector (2), the surface subjected to enameling with porcelain has no regular reflective ability at all, even though, but only diffusedly reflected light or dispersed light can be obtained.

In the case of the reflector (3), since the surface is metal, chemical-, weather- and abrasion-resistance are bad, and regular reflection property is good but total reflective ability is not good in the case of the electrolytic deposition by metal such as nickel and chromum. As electrolytic deposition is a wet method it has the disadvantage that there is an environmental pollution problem of chemicals to be used, etc.

In the case of the reflector (4the art) has attempted to settle the disadvantages of the abovementioned ones and the metallic surface is protected and it is excellent in the high regular reflectivity, but the thermal weather-, abrasion-, light- and chemical-resistance of the resin becomes a problem.

In more detail, reflectors with poor resistance to light, heat and weather have the disadvantages that on being used for a long time, the surfaces may be colored or lose transparency; the surfaces may be polish injured when wiped with cloth for cleaning; thicker resin under coat layers may deteriorate the properties because of bigger absorbancy of light and infrared beams which elevate temperatures of the surfaces.

As mentioned above, the conventional reflector, the whole of which is composed of metals or inorganic substances has the problems that light regular reflective or total reflective ability are poor, or the surface has poor resistance to chemicals, weather and abrasion.

And if the surface is protected with the use of resin, the conventional resin to be used has the problem that it has poor resistance to heat, light and weather.

The present invention is intended to provide a reflector of which the whole is composed of metal or inorganic substances and which reflector has excellent regular reflective and total reflective ability, and has been attained by using metal or inorganic substance as a substrate and disposing a light reflective metal vacuum deposited layer on the substrate surface and further a ceramic vacuum deposited layer thereon.

As metals of the substrate not only are listed simple metallic substances such as iron, stainless steel, copper, brass, bronze, nickel, aluminum and duralumin or the alloys thereof but also a metal plate such as a galvanized or tin-plate sheet, in which the surface, which is coated with metal, will do. And as inorganic substance for the substrate are listed glass, ceramics, mica, etc. But they are not limited thereto.

As light reflective metals to be vacuum coated to form a light reflecting surface of the reflector of the present invention, typical are light reflective metals such as aluminum, duralumin, silver, while gold, gold, nickel and chromum, but they are not limited thereto.

As a light transmittable crystalline ceramic to be vacuum coated on the light reflective metal vacuum coated layer, the typical ceramic materials are ceramics of oxide series such as alumina, magnesia, zirconia and spinel; iolite ceramics such as cordierite; high alumina ceramic such as mullite ceramics; zircon ceramics; lithia ceramics such as pyroceram; steatite ceramics; titanium oxide ceramics an celsian ceramic. However, a crystalline protective film obtained by vacuum coating may be a ceramic which becomes light transmittable and is not limitative to the abovementioned ceramics.

Its selection is made according to the purpose and use of the reflector. For example, if heat resistance and acid resistance are needed, an oxide ceramic and a high alumina such as mullite ceramic is desirable, and when alkali resistance is needed, ceramics of fayalite, serpentine, etc. are preferable and when heat resistance is needed, an iolite ceramic, a lithia ceramic and so forth are better, and particularly when thermal expansion and shrinkage is required to be small, lithia ceramic such as pyroceram, etc. are preferably used.

The features of a light transmittable ceramic protective film are that ceramics are crystallizable whereas silica, glass, etc. are amorphous. Thus, the properties differ and a vacuum deposited ceramic film has the following excellent features as compared with a vacuum deposited film of silica, glass, etc.

(1) It is difficult to conduct uniform coating for silica, glass, etc. having deep dents or complicated shapes, but in vacuum coating of ceramics, uniform coating can be conducted very easily for the above materials as well.

(2) In accordance with environment of use, appropriate ceramics can be selected or according to the kind of ceramic or quality of a substrate the one having good affinity can be chosen to obtain by vacuum coating a highly dense light transmissible protective film, superior in tackiness and impermeable to solvent, water, chemical solutions, etc. Hence, the durability of a reflector is also excellent.

(3) A vacuum coated layer of ceramics not only used as a protective layer to give strength of a reflector but also to give other properties. For example, as a ceramic having a low-degree of oxidation is sometimes electrically conductive, it can provides antifog properties by applying an electric current thereto and it can easily have the functional ability of light translucency and random reflection.

(4) To color silica, glass, etc. it is necessary to add other colorants, but ceramics can be self-colored easily. Accordingly, variously colored reflectors can be easily obtained by vacuum coating of a natural colored ceramic.

As a method of vacuum coating on the substrate of a light reflective metal, there are vacuum evaporation, sputtering and ion plating methods.

Vacuum evaporation is the simplest method, but since only kinetic energy of metal coating particles in the mean free path is utilized, there is only energy of 0.1 eV or below at most and the degree of penetration to the substrate becomes 1 Å or below, only a weak coated film can be formed. And since bond strength between the substrate and a metallic film is low and density of the film is small, peel strength is low. The mean free path in said method becomes longer as particle weight of metal is small and degree of vacuum and temperature are high. Accordingly, a metal having a small atomic weight or small atomic diameter is easy to coat, and it is advisable to conduct the coating at a degree of vacuum of at least $10^{-4}$ Torr, preferably $10^{-5}$ Torr or below. One power of 10 difference of the degree of vacuum causes the difference of 10 times of mean free path, the degree of vacuum is the most important parameter for vacuum evaporate.

For example, if in the molten state of ceramic under vacuum, there is the degree of vacuum loss by two power of 10 or above of the set degree of vacuum, control of vacuum evaporation method is difficult and it is difficult to obtain the desired coated film strength.

On the other hand, temperature contributes to the mean free path by a square root of absolute temperature, it does not become so big a factor.

In the case of use of a light reflective alloy, when mutual metals make a molecular compound or mean free paths or evaporation speeds resemble closely each other, a method of vacuum evaporation can be employed, but if that is not the case, since each metal constituting the light reflective alloy dissociates and is vacuum evaporated separately, a nonuniform or weak film is formed; thus a method of sputtering had better be employed.

The method of sputtering is the one of causing excited particles having kinetic energy faster in speed than in the method of vacuum evaporation to impinge on the substrate and be coated on it. Kinetic energy is several 10–100 eV and more and several Å–several 10 Å penetrates into the substrate; and consequently, a coated film high and great in strength and durability as compared with that in the method of vacuum evaporation is obtained and light reflection property of a metal coated film is considerably good also. And in case of coating a light reflective alloy, in the method of vacuum evaporation, the coating is carried out by evaporation of an alloy melt, whereas this method has the advantage that dissociation of components is hard to occur because gases are formed by sublimation from a solid target, and thus, coating is possible.

However, this method has the disadvantage that since it is inconvenient that coating materials should be used as a so-called target molded into a special shape such as a circular plate or cylinder, and coating speed is slow, production efficiensy is poor.

A method of ion plating is further classified into several types of method and when using a method having good efficient coating, a coated film with the penetration into the substrate of several 100 Å can be obtained by several KeV energy. This method different from the abovementioned two methods does not use neutral particles but cation particles. Since cation particles move by electric voltage acceleration toward the substrate placed in an electric field, that is, a cathode, flying speed becomes faster than in the sputtering method. And since the particles are cations, particle diameter is small and its mean free path becomes longer than in the vacuum evaporation method or the sputtering method.

Typical are the following in the ion plating methods (1) Plasma ion plating method This is to apply an voltage of several 100–several 1000 V between the coating materials and the substrate under a reduced pressure of $10^{-2}$–$10^{-3}$ Torr, conduct glow discharge, ionize evaporating neutral particles in the generated plasma and carry out the coating. The feature of this method is that the ionization rate is several 10% higher and a strong coated film can be formed and there is the advantage that as particles fly along a line of electric force in the electric field, and back side coating is possible. However, temperature rise in the cathode is great, heat resistance of the substrate is needed and the mean free path is short, and hence, there is the disadvantage that in coating a large-sized article, one requires contrivance.

(2) RF ion plating method

This is a method of passing evaporated particles through a high frequency oscillating coil, ionizing and coating them. This method is characterized in that it has the advantage that since glow discharge is not in use, coating is possible even with a degree of vacuum of $10^{-3}$–$10^{-4}$ Torr and the temperature rise of a cathode is little, but on the other hand, since an ionization ratio is small and coating the size more than the diameter of an RF oscillating coil is difficult, there is the disadvantage that coating having a large projected area is hard to produce.

(3) Applied voltage method

This is an applied voltage method in which vacuum coating is conducted under a reduced pressure of $10^{-4}$–$10^{-5}$ Torr on the same condition as in the plasma ion plating method of (1) above. In the present method, a little or no glow discharge is observed visually, bit a cathode current can sufficiently be observed; with the degree of vacuum lower than around $10^{-4}$ Torr and an electric voltage gradient of several 10 V/cm or above, this method is fairly effective. This is a method has the intermediate characteristics of those of the plasma ion plating method and the vacuum evaporation method.

(4) Method of using ion gun

Methods (1)–(3) particles preliminarily evaporated by resistance heating or an electron beam are ionized in electric field plasmas or high radio frequency, whereas this method is to conduct direct ionization with a gun.

In this method, typical are an i-gun method and a hollow cathode method in which to use high frequency. In both, ionization efficiency is high and there is the advantage that even in the vacuum system high in the degree of vacuum coating is possible.

In conducting an ion plating method, it is important to fully take these features into consideration and carry out coating. Or in case of metal coating, a light reflecting surface colors or becomes turbid in some cases to lower reflectivity.

In case of coating a light reflective metal, to improve light reflective ability it is necessary to remove a reactive gas such as air as much as possible. Otherwise, total reflectivity drops or the light reflecting surface colors or discolors in some cases.

Vacuum coating of a ceramic can be made with the use of a device of vacuum coating the above light reflective metal. However, operations for a light reflective metal and a ceramic considerably differ from each other.

First, energy needed for melting, sublimation and evaporation of a ceramic is very high as compared with that of a light reflective metal. Accordingly, in case of any coating methods, the time for coating ceramics becomes long as compare with that in case of a light reflective metal, and in methods of carrying out gasification and ionization as well, crystalline ceramics are more restrictive. For example, many of light reflective metals can be melted and gasified by resistance heating using a high melting metal, but for most ceramics, resistance heating cannot be employed but an electron beam or ion beam should be employed for their gasification.

Secondly, since a light reflective metal has a great thermal conductivity, if part of it is heated, the whole metal is uniformly heated and melted, but as for a crystalline ceramics, only the heated portion and its neighborhood are often melted. As a crystalline ceramic to be used in the present invention has vacuum coating characteristics different from a metal, vacuum coating should be carried out with this point as well in mind.

As its typical example, in case of ordinary coating of alumina, the film often becomes yellow or in an extreme case blackish brown, but in the present invention, in such a case, by the full supply of oxygen or by a reaction coating with oxygen, this problem has been successfully solved and colorless, transparent coated film has thereby been obtained.

Thirdly, since the mean free path of ceramics is shorter than that of light reflective metals in many cases, severer conditions of a high degree of vacuum, an elevated temperature, a high ionization ratio, etc. than in light reflective metals should be carried out, in case of other conditions are same. For example, aluminum can be vacuum deposited even by the order of $10^{-4}$ Torr, but it is hard for silicon dioxide to bring a satisfactory deposited film, unless it is vacuum coated in the order of degree of vacuum of $10^{-5}$ Torr. In the case of sputtering, ceramics are by far slower than light reflective metals in coating speed. In the case of ion plating, ionization of ceramics is hard as compared with in a light reflective metal, and as the coated substrate, that is, the cathode is insulated, ion plating is likely to be hard to conduct. This is particularly the case in case of the ion plating method in which cathode voltage is high and an ion current is great as in a plasma ion plating.

In such a case, a considerable improvement is obtained by not using the substrate as a cathode and by preparing a cathode in which a metal net is arranged in the neighborhood of the substrate. In case of a plasma ion plating method, applied voltage is maintained to from ionization voltage or above to ordinarily about 10 KV or below, and coating is conducted at least at a reduced pressure of $10^{-3}$ to 1 Torr, and preferably, in the order of a reduced pressure of $10^{-2}$ Torr. If the degree of reduced pressure is too high, glow discharge will fail to occur or the cathode dark space will disappear, whereas if the degree of reduced pressure is too low, are discharge or spark discharge will occur to disadvantage in some cases. In case an ion generating device such as RF ion plating, a high frequency ionization gun and a hollow cathode is used, coating is possible some times even at a degree of vacuum up to the highest $10^{-4}$ Torr. When an ionization ratio is sufficiently high, the mean free path of substance particles becomes longer than in case of vacuum evaporate and if applied voltage becomes greater, the means free path becomes further longer; thus, the advantage of ion plating is that even with the low degree of reduced pressure, coating is possible.

However, since the ionization voltage of ceramics is great and the mean free path is short, it is advisable that plasma ion plating of as high excitation voltage as possible be carried out, or a hollow cathode or high frequency ion gun be used. If in this case materials which differ too much from each other in the means free path or an ion rate, a film surface loses transparency or discolors and a coated film becomes a non-uniform composition in some cases; it is desirable that as chemically uniform materials as possible be used. And since sometimes oxygen defect occures, it is preferable to conduct coating in an oxygen atmosphere.

Further, the layers referred to in the present invention are not restricted to a layer consisting of a single material. For example, the vacuum deposited layer of a light reflective metal may consist of a laminate of two types of metal such as copper and aluminum, and a light transmissible crystalline ceramic layer may consist of a laminate of two types of crystalline ceramic.

Some of the thus obtained reflectors can demonstrate high durability immediately after the completion of the preparation, but the reflector is usually allowed to (1) stand for several days at room temperature, (2) it is heated for several 10 minutes to several hours below a heat distortion temperature, (3) durability can be increased by conducting aging such as repeating several times heating and cooling below a heat distortion temperature.

The light transmittable crystaline ceramic vacuum deposited layer in the reflector of the present invention has the following excellent features as compared with a layer of silica, glass, etc. in the conventional reflector.

(1) Since silica, glass, etc. are amorphous, whereas crystalline ceramics are crystalline, the properties differ each other and crystalline ceramics have the following excellent characteristics which cannot be found in silica, glass, etc.:

The reflector of the present invention has the following excellent features:

(1) A light reflective metal and a crystalline ceramic are together vacuum coated and coating can be continuously conducted with the same apparatus, resulting in easy preparation.

(2) Since a crystalline ceramic is vacuum coated, unlike the case of using the conventional resin coating, it can form a thin film of the same replica as a light reflective metal film, light refraction or absorption by a protective film is very little and changes of total reflectivity, regular reflectivity and refractivity are little. What is more, there is little loss of transparency or coloring degradation with the time which has been the case with a resin protective film.

(3) The light transmittable ceramic layer excels in heat-, light-, weather- and solvent-resistance, and as its surface is highly dense, even if it is used with the time and polluted with oils, it is not corroded and yet there are few rubbed scratches even by wiping pollutants; thus the layer can stand long-term use. It also has good resistance to oil and abrasion resistance.

(4) The above mentioned light transmissible ceramic film can be a thin film obtained by vacuum coating as compared with a resin film and has a high heat conductivity; thus in using it as a reflector for lighting fixtures, temperature rise in the coated film is small.

(5) Since the substrate is of metal or inorganics, it has high heat resitance, and thus, the whole reflector is also highly heat resistant.

EXAMPLE 1

A sodium glass board 0.1 cm thick and 15 cm$^2$, having an even surface was placed in a bell jar in a vacuum coater and held at a distance of 30 cm from a hearth liner right above, and in parallel with, the same; a degree of vacuum was set at $2\times10^{-5}$ Torr and thereafter with an electron beam, aluminum was evaporated by heating; vacuum coating was conducted for 30 seconds on a substrate of room temperature under the conditions of an applied voltage of $-3$ KV, an EB output of 2.5 KW, and a coating pressure of $4\times6\times10^{-5}$ Torr, as given in Table 2, 1.

Subsequently, a degree of vacuum was set at $2\times10^{-5}$ Torr, and then an oxygen gas was introduced into the bell jar up to $5\times10^{-3}$ Torr. And again the pressure was reduced to $2\times10^{-5}$ Torr. The same procedure was repeated twice and then in the oxygen atmosphere magnesia was evaporated by heating with an electron beam and vacuum coating was conducted for 5 minutes under the conditions of an applied voltage of $-0.7$ KV, an EB output of 1 KW and an coating pressure of $7-9\times10^{-5}$ Torr.

On dipping in a 10% aqueous solution of sodium hydroxide for 30 minutes the reflector having the thus obtained light transmissible magnesia protective film, it was discovered that there was no change at all of reflectivity and an external appearance such as discoloration of the surface, and yet an excellent tackiness of 100/100 was given in the checker board test. Accordingly, this is most suitable as a reflector for lighting fixtures of a plant manufacturing alkaline chemicals such as sodium hydroxide. And it is also suitable as an interior decoration material mirror of a lobby, floor or showroom, etc. of a building.

EXAMPLE 2

A stainless steel sheet 0.04 cm thick and 10 cm$^2$, having an even surface was held with a substrate holder in a sputtering apparatus, and on the other hand, as a target was used a board-like nickel. A distance from the substrate to the target was set at 10 cm and the degree of reduced pressure in a bell jar was evacuated to $6\times10^{-6}$ Torr, and then an argon gas was introduced and pressure was raised to $2\times10^{-3}$ Torr. While a shutter was being closed, cleaning sputtering was done for 5 minutes at an output of 4.5 KW and a high frequency of 13.56 MHz to clean the target surface and stabilize the target; then the shutter was opened and sputtering of nickel was conducted for 7 minutes.

Then, as a target was used s sheet-like alumina and the same distance as above was set and under the same conditions, cleaning sputtering was conducted for 10 minutes, while the shutter was being closed. Afterwards the shutter was opened and sputtering of alumina was conducted for 100 minutes.

On making a heat test in a constant temperature bath of 180° C. for the reflector having the thus obtained light transmittable alumina protective film and dipping it in city water for 3 days, it was discovered that in each test there was no abnormal change; there was no scratches even by vigorous rubbing with gauze; there was no peel by the checkerboard test; the reflector had excellent resistance to heat, water and abrasion and good tackiness. This is suitable for a mirror for a commodity case and a mirror for interior decoration material of a store or a lobby, floor, showroom, etc. of a building.

EXAMPLE 3

An aluminum board 0.1 cm thick and 10 cm$^2$, having an even surface was fully degreased, washed and dried. This was held at a distance of 4 cm from a high frequency oscillation coil 10 cm in diameter and 10 cm in height arranged at a distance of 8 cm right above a hearth liner within a vacuum coater; a degree of vacuum within a belljar was set at $1\times10^{-5}$ Torr and an argon gas was introduced and the pressure was raised to $5\times10^{-3}$ Torr and then reduced again to $1\times10^{-5}$ Torr the same procedure being repeated twice. Aluminum was evaporated by heating with an electron beam under the conditions of an applied voltage of $-1.5$ KV, an EB output of 1.5-2 KW, and a coating pressure of $5\text{-}6\times10^{-4}$ Torr as shown in 3 in Table 2 RF output being 300 W, frequency being 13.56 MHz and while the argon gas partial pressure was being maintained at $5\text{-}6\times10^{-4}$ Torr, the substrate being at a normal temperature state. The evaporated particles were passed through a high frequency coil and coating was carried out for 30 seconds.

Then, after the degree of vacuum was reduced to $1\times10^{-5}$ Torr, an oxygen gas was introduced, the pressure was raised to $5\times10^{-3}$ Torr and then reduced again to $1\times10^{-5}$ Torr, the same procedure being repeated twice. Alumina was coated by the same procedure as above in the oxygen atmosphere under the conditions of an applied voltage of $-1$ KV, an EB output 1-1.5 kw and a coating pressure of $5\text{-}7\times10^{-4}$ Torr.

On making a heat test in a constant temperature bath of 180° C. about the reflector having the thus obtained colorless transparent alumina protective film, it was discovered that there was no change of the surface as well as reflectivity and the reflector had high resistance to heat. And even with the dipping in city water for 3 days there was no abnormal change. There was no scratches by severe rubbing with gauze and there was no peel by the checkerboard test. The reflector had excellent resistance to heat, water and abrasion and good tackiness. As a mirror for interior decoration material for a lobby, floor, showroom, etc. the reflector will not break, has high safety and is suitable for brightening the interior of a room and increasing the interior decoration effect.

EXAMPLE 4

An aluminum board 0.1 cm thick and 15 cm$^2$ was degreased, washed and dried. It was placed in a bell jar of a vacuum coater and held at a distance of 25 cm from a hearth liner just above, and in parallel with, the same. The degree of vacuum was set at $2\times10^{-5}$ Torr and a nitrogen gas was introduced to raise pressure to $5\times10^{-3}$ Torr and again it was reduced to $2\times10^{-5}$ Torr and the same procedure was repeated twice. In the nitrogen atmosphere glow discharge was caused under the conditions of an applied voltage of 1 KV, an EB output of 1.5 KW and a coating pressure of $2\text{-}3\times10^{-3}$ Torr as shown in 4 in Table 2, metallic titanium was evaporated by heating with an electron beam. A reaction coating of titanium was conducted for 5 minutes. After the degree of vacuum was set at $1\times10^{-5}$ Torr, an oxygen gas was introduced to raise pressure to $5\times10^{-3}$ Torr, and again it was reduced to $1\times10^{-5}$ Torr, the same procedure being repeated twice. Then, in the oxygen atmosphere, mullite was evaporated by heating with an electron beam and under the conditions of an applied voltage of $-0.7$ KV, an EB output of 1.5 KW amd a coating pressure of $8-9\times10^{-5}$ Torr, vacuum coating was conducted for 7 minutes.

On making a heat test in a constant temperature bath of 180° C. for a titanium nitride reflector having a transparent mullite protective film, it was discovered that after 3 days' dipping in city water there was no abnormal change and that the reflector has high resistance to heat and humidity. Moreover no scratches were caused by vigorous rubbing with gauze showing that it has excellent abrasion resistance. Since titanium nitride assumes a beautiful golden luster, the reflector is suitable for an interior decoration mirror, a ceiling light reflective mirror and interior mirrors for a shop or showroom.

In Table 1 listed are the embodiments of the present invention and in Table 2 listed are the conditions in each embodiment of the present invention.

TABLE 1

| Layer | Construction of Reflector | |
|---|---|---|
| | | Materials |
| 3 | Protective film | Ceramic (vacuum coated) |
| 2 | Reflective metal | Metal (vacuum coated) |
| 1 | Substrate | Metal or non-metallic, non-resinous |

TABLE 2

| Number | Examples | | Working condition of multilayer coated reflector of the present invention | | | |
|---|---|---|---|---|---|---|
| | | | 1 | 2 | 3 | 4 |
| 3 | Protective film | Inorganics | Magnesia | Alumina | Alumina | Mullite |
| | | Atmosphere | Oxygen | Argon | Oxygen | Oxygen |
| | | Applied voltage | $-0.7$ KV | | $-1$ KV | $-0.7$ KV |
| | | EB Power | 1.0 KW | | 1–1.5 KW | 1.5 KW |
| | | Coating pressure, time | $7-9\times10^{-5}$ Torr (5 minutes) | $2\times10^{-3}$ Torr (100 minutes) | $5-7\times10^{-4}$ Torr (7 minutes) | $8-9\times10^{-5}$ Torr (7 minutes) |
| 2 | Metal | Light reflective metal | Aluminum | Nickel | Aluminum | Titanium |
| | | Atmosphere | Air | Argon | Argon | Nitrogen |
| | | Applied voltage | $-3$ KV | | $-1.5$ KV | $-1$ KV |
| | | EB Power | 2.5 KW | | 1.5–2 KW | 1.5 KW |
| | | Coating pressure, time | $4-6\times10^{-5}$ Torr (30 seconds) | $2\times10^{-3}$ Torr (7 minutes) | $1-6\times10^{-4}$ Torr (30 seconds) | $2-3\times10^{-3}$ Torr (5 minutes) |
| 2 | Resin layer | | | | | |
| 1 | Substrate | Nonmetal | Sodium glass | | | |
| | | Metal | | Stainless steel | Aluminum | Aluminum |
| | | Vacuum coating method | Electric field vacuum deposition | Sputtering method | R.F ionplating method | Reaction coating and Electric field vacuum deposition |

What is claimed is:

1. A heat resistant reflector consisting essentially of a vacuum deposited light reflective metal layer disposed directly on (1) a metallic substrate or (2) a non-metallic, non-resinous substrate and a light transmittable preexisting ceramic vacuum deposited protective layer having low light refractivity and absorption further disposed on said substrate.

2. A reflector as set forth in claim 1 wherein said light transmittable ceramic undergoes loss of the degree of vacuum within only 100 times the set degree of vacuum in the molten state of the ceramic under a vacuum of $10^{-1}$–$10^{-5}$ Torr.

3. A reflector as set forth in claim 2 wherein said ceramic vacuum deposited layer is formed from a crystalline ceramic starting material.

4. A reflector as set forth in claim 3 wherein the vacuum deposited ceramic layer is crystalline.

5. A reflector as set forth in claim 1 wherein the non-metallic, non-resinous substrate is an inorganic compound.

6. A reflector as set forth in claim 5 wherein the vacuum deposited ceramic is a ceramic oxide.

7. A reflector as set forth in claim 5 wherein the vacuum deposited ceramic is an oxide ceramic, an iolite ceramic, a high alumina ceramic, a zircon ceramic, a lithia ceramic, a steatite ceramic or a titanium oxide ceramic.

8. A reflector as set forth in claim 7 wherein the ceramic is alumina, magnesia, zirconia, spinel or mullite.

* * * * *